(12) United States Patent
Ikeda et al.

(10) Patent No.: US 10,304,496 B2
(45) Date of Patent: May 28, 2019

(54) SEMICONDUCTOR DEVICE AND ELECTRONIC EQUIPMENT

(71) Applicant: Toshiba Memory Corporation, Minato-ku (JP)

(72) Inventors: Shinichi Ikeda, Fujisawa (JP); Takuma Aoyama, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/700,616

(22) Filed: Sep. 11, 2017

(65) Prior Publication Data
US 2018/0277170 A1    Sep. 27, 2018

(30) Foreign Application Priority Data

Mar. 23, 2017  (JP) ................. 2017-058120

(51) Int. Cl.
| | |
|---|---|
| *H03L 7/08* | (2006.01) |
| *G11C 5/06* | (2006.01) |
| *G11C 5/14* | (2006.01) |
| *H05K 1/02* | (2006.01) |
| *H03L 7/089* | (2006.01) |
| *H01L 23/48* | (2006.01) |
| *G11C 7/02* | (2006.01) |

(52) U.S. Cl.
CPC ............. *G11C 5/063* (2013.01); *G11C 5/143* (2013.01); *G11C 5/147* (2013.01); *G11C 7/02* (2013.01); *H01L 23/48* (2013.01); *H03L 7/0898* (2013.01); *H05K 1/0231* (2013.01); *H05K 1/0234* (2013.01)

(58) Field of Classification Search
CPC ................. G11C 5/063; G11C 5/147
See application file for complete search history.

(56) References Cited

U.S. PATENT DOCUMENTS

| | | | | |
|---|---|---|---|---|
| 5,844,762 | A * | 12/1998 | Yamamura ........... | H05K 1/0234 361/111 |
| 6,700,771 | B2 * | 3/2004 | Bhattacharyya ....... | B82Y 10/00 361/311 |
| 6,781,355 | B2 * | 8/2004 | Gauthier ................... | G06F 1/26 323/233 |
| 6,806,569 | B2 * | 10/2004 | Breisch ................... | H01L 23/48 257/691 |

(Continued)

FOREIGN PATENT DOCUMENTS

| | | |
|---|---|---|
| JP | H11-074449 | 3/1999 |
| JP | 2003-258612 | 9/2003 |
| JP | 2009-246062 | 10/2009 |

*Primary Examiner* — Alexander H Taningco
*Assistant Examiner* — Kurtis R Bahr
(74) *Attorney, Agent, or Firm* — Oblon, McClelland, Maier & Neustadt, L.L.P.

(57) ABSTRACT

A semiconductor device includes an input/output circuit to which a signal is input or from which a signal is output; a first terminal connected to a power line of the input/output circuit; a second terminal connected to the power line; a resistance element connected between the second terminal and the power line; and a first capacitance element connected between the second terminal and a ground terminal. The semiconductor device can suppress a resonance phenomena and Volt age variation caused by impedance of the power line.

18 Claims, 10 Drawing Sheets

(56) References Cited

U.S. PATENT DOCUMENTS

| | | | |
|---|---|---|---|
| 7,593,650 B2 * | 9/2009 | Kagaya | H03F 3/087 |
| | | | 398/202 |
| 7,852,145 B2 * | 12/2010 | Uematsu | G06F 1/26 |
| | | | 327/545 |
| 8,208,338 B2 * | 6/2012 | Kim | H01L 23/50 |
| | | | 365/226 |
| 9,380,704 B2 * | 6/2016 | Kashiwakura | H05K 1/0246 |
| 2004/0195629 A1 * | 10/2004 | Lai | H01L 27/0251 |
| | | | 257/355 |
| 2007/0262794 A1 * | 11/2007 | Chen | G06F 1/26 |
| | | | 327/32 |
| 2009/0243658 A1 | 10/2009 | Tokoi et al. | |
| 2010/0073048 A1 * | 3/2010 | Ke | H03L 7/0898 |
| | | | 327/157 |

* cited by examiner

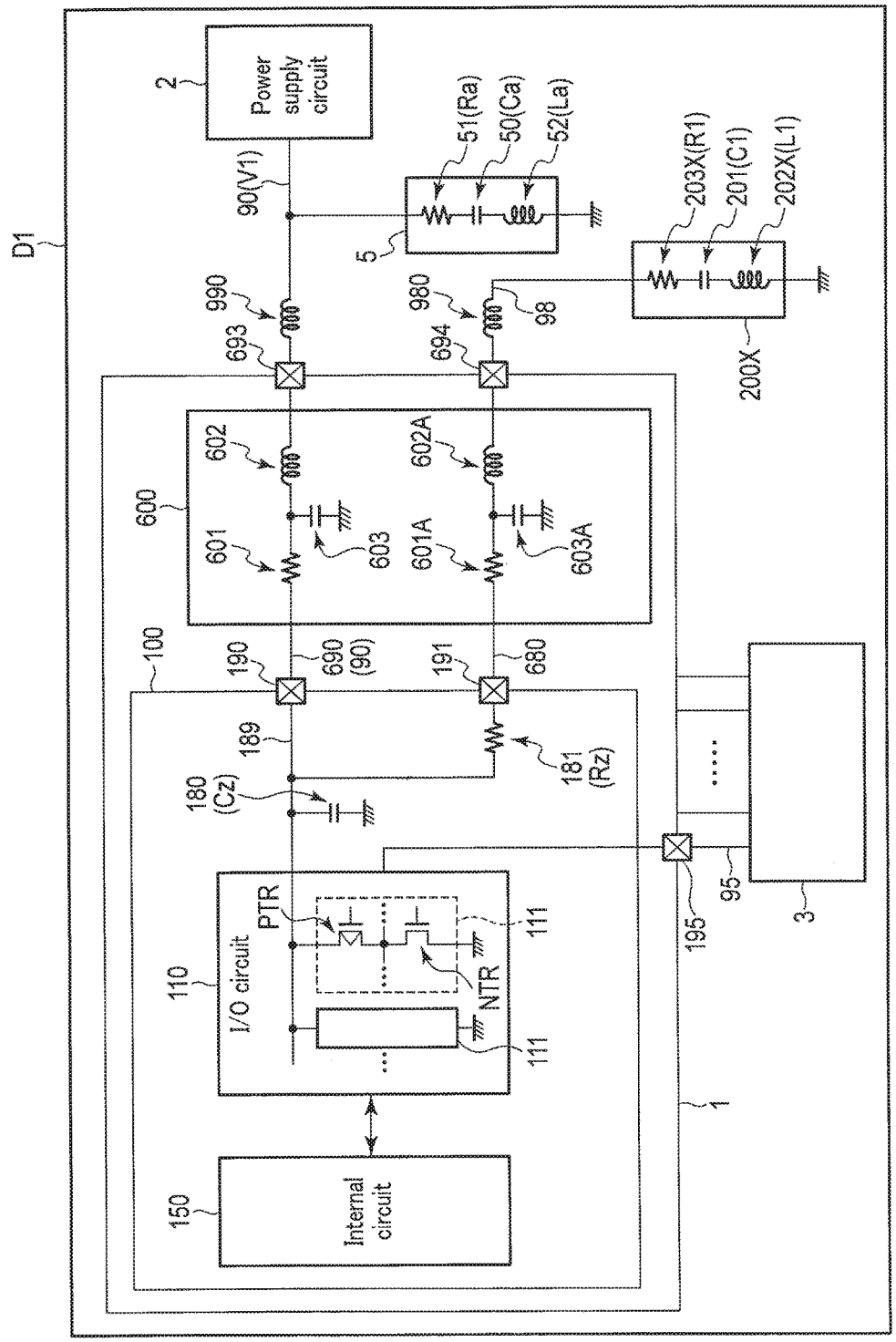
F I G. 6

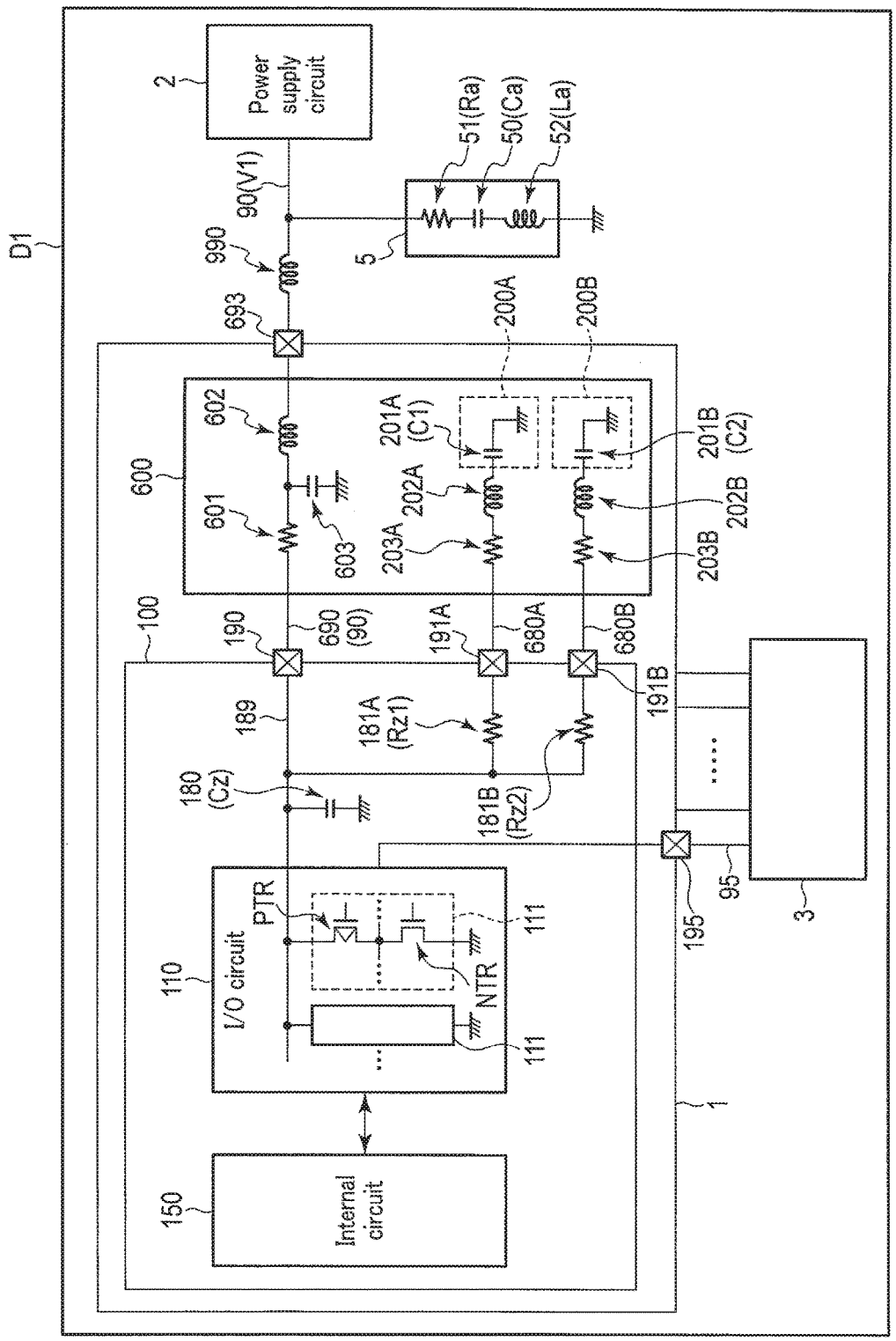
F I G. 7

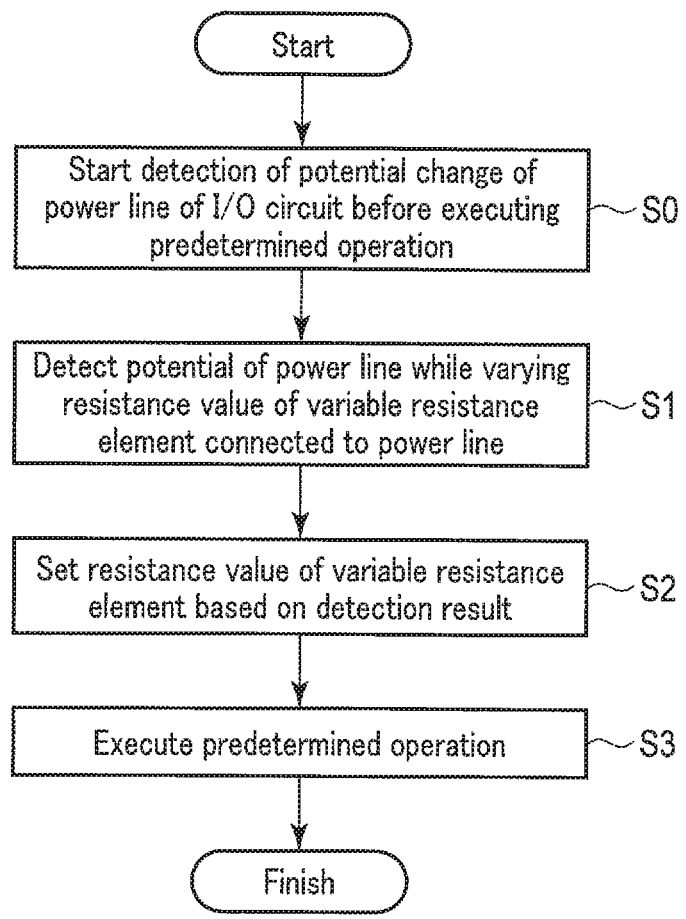
F I G. 10

SEMICONDUCTOR DEVICE AND ELECTRONIC EQUIPMENT

CROSS-REFERENCE TO RELATED APPLICATIONS

This application is based upon and claims the benefit of priority from Japanese Patent Application No. 2017-058120, filed Mar. 23, 2017, the entire contents of which are incorporated herein by reference.

FIELD

Embodiments described herein relate generally to a semiconductor device and electronic equipment.

BACKGROUND

In electronic equipment including an electronic device like a semiconductor device, there are cases where a power-supply voltage to be supplied to a circuit varies resulting from impedance of a power line for supplying a voltage to the circuit inside the electronic device.

This may degrade operation characteristics of the electronic device.

BRIEF DESCRIPTION OF THE DRAWINGS

FIG. 6 is a diagram showing a configuration example of electronic equipment and a semiconductor device according to a second embodiment.

FIG. 7 is a diagram showing a configuration example of electronic equipment and a semiconductor device according to a third embodiment.

FIG. 10 is a flowchart showing an operation example of the electronic equipment and the semiconductor device according to the fourth embodiment.

SUMMARY

Embodiments herein disclose a semiconductor device that can suppress a resonance phenomena and voltage variations caused by impedance of a power line. The semiconductor device includes: an input/output circuit to which a signal is input or from which a signal is output; a first terminal connected to the power line of the input/output circuit; a second terminal connected to the power line; a resistance element connected between the second terminal and the power line; and at least a capacitance element connected between the second terminal and a ground terminal.

DETAILED DESCRIPTION

In general, according to one embodiment, a semiconductor device includes an input/output circuit to which a signal is input or from which a signal is output; a first terminal connected to a power line of the input/output circuit; a second terminal connected to the power line; a resistance element connected between the second terminal and the power line; and a first capacitance element connected between the second terminal and a ground terminal.

EMBODIMENTS

In reference to FIGS. 1 to 11, electronic equipment and semiconductor devices according to the embodiments will be explained.

In the following embodiments, elements including the same functions and the same configurations are provided with the same signs. In addition, in the following embodiments, if configuration elements provided at the end of reference signs of alphanumeric characters for differentiation are not differentiated mutually, expressions will be used in which the alphanumeric characters at the end of reference signs are omitted.

(1) First Embodiment

In reference to FIGS. 1 to 5, the electronic equipment and the semiconductor device according to the first embodiment will be explained.

(a) Overall Configuration

The overall configuration of the electronic equipment according to the present embodiment will be explained using FIGS. 1 and 2.

Figure 1:
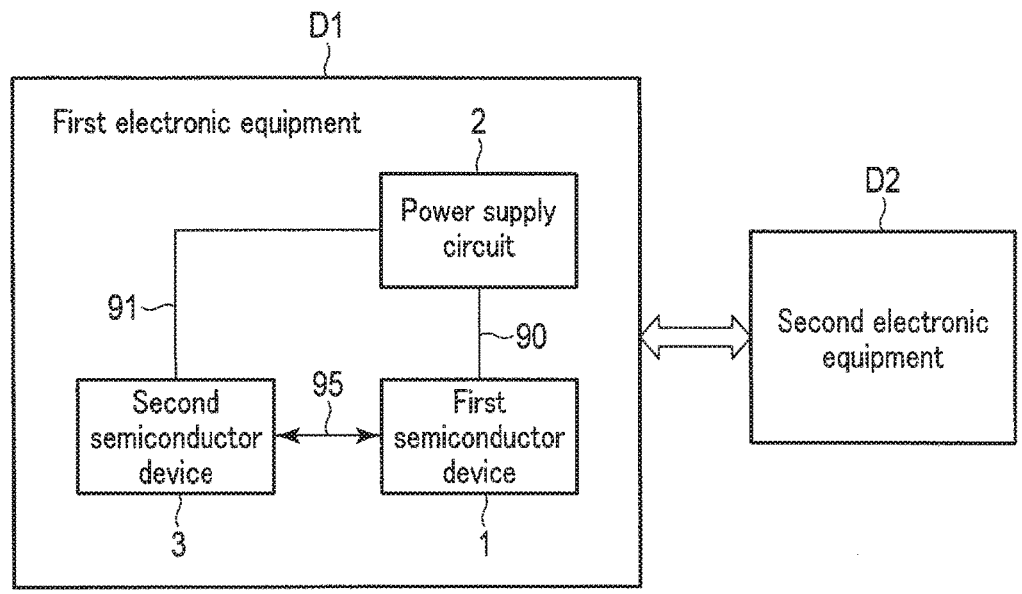
FIG. 1 is a diagram showing an overall configuration of electronic equipment according to a present embodiment.

FIG. 1 is a block diagram schematically showing the overall configuration of the electronic equipment according to the present embodiment.

As shown in FIG. 1, electronic equipment D1 of the present embodiment includes a plurality of electronic devices (e.g., semiconductor devices) 1, 2, and 3.

The plurality of electronic devices 1, 2, and 3 are connected via interconnects 90, 91, and 95.

The electronic devices 1, 2, and 3 respectively include a semiconductor chip provided in an insulative package.

The electronic devices 1, 2, and 3 are each one semiconductor device selected from a system LSI, a semiconductor circuit, a semiconductor memory, a controller, and a processor.

The electronic device 1 is connected to the electronic device 2 via the interconnect 95. The electronic devices 1 and 3 can transmit and receive a signal by the interconnect 95. For example, the electronic device 1 is a controller. For example, the electronic device 3 is a semiconductor memory (e.g., NAND type flash memory). Note that the semiconductor memory may be DRAM, SRAM, MRAM or ReRAM.

The electronic device 2 is a power supply circuit.

The power supply circuit 2 supplies a voltage to the electronic devices 1, and 3 via the interconnects 90, and 91.

For example, the electronic equipment D1 including the devices 1, 2, and 3 of the present embodiment is electrically connected to other electronic equipment D2. For example, the electronic equipment D1 can communicate with the electronic equipment D2 by at least one of a cable, wiring, internet, intranet, and wireless communication.

Figure 2:
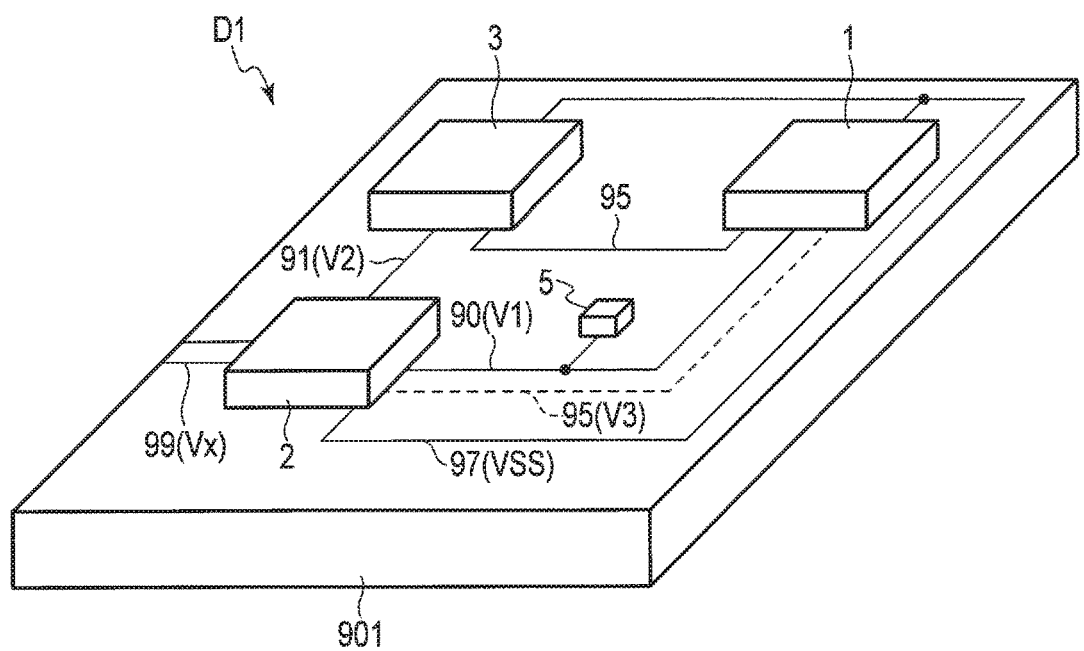
FIG. 2 is a diagram showing the overall configuration of electronic equipment according to the present embodiment.

FIG. 2 is a bird's eye view diagram schematically showing the overall configuration of the electronic equipment according to the present embodiment.

As shown in FIG. 2, the plurality of electronic devices 1, 2, and 3 in the electronic equipment of the present embodiment are provided on a printed wiring substrate (e.g., mother board) 901.

The plurality of electronic devices 1, 2, and 3 are connected via interconnects 90, 91, 95 and 97 on a top surface of the printed wiring substrate 901. The electronic devices 1, 2, and 3 may be mutually connected by (unillustrated) interconnects inside the printed wiring substrate 901, or by (unillustrated) interconnects on a rear surface of the printed wiring substrate 901.

The power supply circuit 2 is connected to an external power source (e.g., battery) VX via an external connection terminal (and wiring) 99 provided on the printed wiring substrate 901. With this configuration, the external power supply voltage VX is supplied to the power supply circuit 2. The power supply circuit 2 generates voltages V1, and V2 supplied to the other devices 1 and 3, using the external power supply voltage VX. The voltages V1, and V2 output by the power supply circuit 2 are, for example, direct-current voltages.

The power supply circuit 2 supplies the voltage V1 to the first electronic device 1 via the interconnect 90. The power supply circuit 2 supplies the voltage V2 to the second electronic device 3 via the interconnect 91. The power supply circuit 2 supplies a ground voltage VSS to the electronic devices 1, and 3 via the interconnect 97.

The first electronic device 1 is driven using the voltage V1, and the ground voltage VSS. The second electronic devices driven using the voltage V2, and the ground voltage VSS.

Note that a voltage V3 which is different from the voltage V1 (and ground voltage) may be applied to the first electronic device 1 via the interconnect 95 which is different from the interconnect 90. Similarly, a voltage which is different from the voltage V2 and ground voltage VSS may be applied to the second electronic device 3.

Hereinafter, for clarification of the explanation, interconnects 90, and 91 to which the voltage V1 or voltage V2 has been supplied are referred to respectively as power lines 90, and 91. The interconnect 97 to which the ground voltage Vss has been supplied is referred to as a ground line 97. Also, hereinafter, with respect to the internal interconnects in the electronic devices 1, 2, and 3, an internal interconnect to which the voltage V1 or voltage V2 has been supplied is referred to as a power line.

The electronic device 1 is connected to the electronic device 3 via the interconnect 95 on the printed wiring substrate 901 so that a signal is transmittable or receivable.

For example, a stabilization capacitor circuit 5 is provided on the printed wiring substrate 901. The stabilization capacitor circuit 5 is connected, for example, to the power line 90. In FIG. 2, only one stabilization capacitor circuit 5 connected to the power line 90 is illustrated for simplification of illustration, however, a plurality of stabilization capacitor circuits are provided on the printed wiring substrate 901. Furthermore, the plurality of stabilization capacitor circuits may be connected to one interconnect.

The electronic devices 1, 2, and 3 have a plurality of external connection terminals. The semiconductor chips inside the electronic devices 1, 2, and 3 are connected to the interconnects 90, 91, 95, 97, and 99 by an external power supply terminal.

Figure 3:
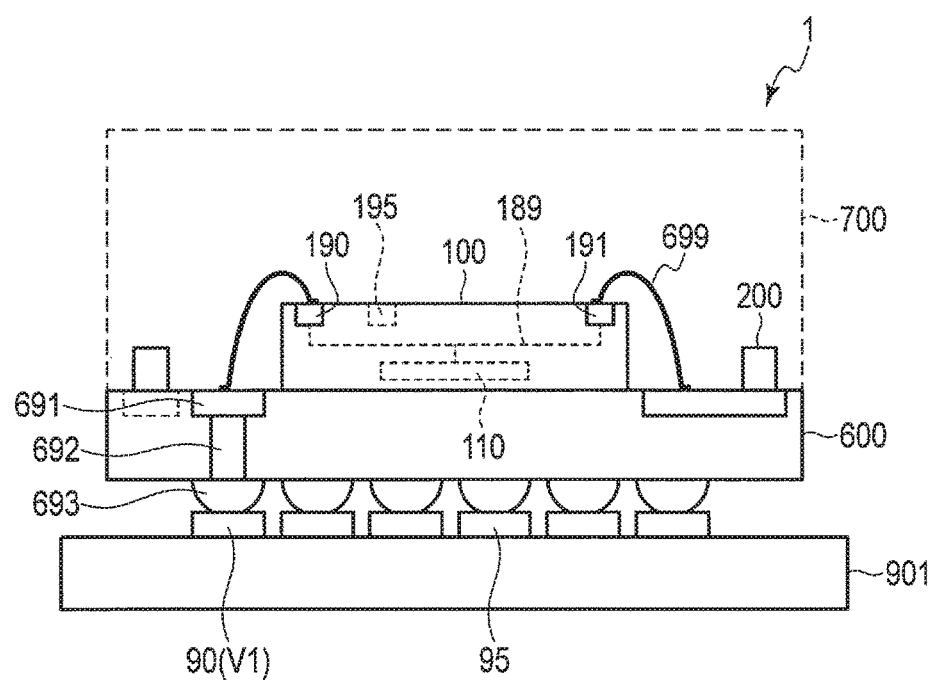
FIG. 3 is a diagram for illustrating a structural example of a semiconductor device according to the present embodiment.

FIG. 3 is a cross-sectional diagram schematically showing a semiconductor device as an electronic device in the present embodiment.

As shown in FIG. 3, in a semiconductor device 1, a semiconductor chip 100 is provided on a package substrate 600. The semiconductor chip 100 is sealed in an insulative package material (mold resin) 700 on the package substrate 600.

The semiconductor chip 100 has a plurality of pads (electrodes) 190, 191, and 195 provided on a front surface or a rear surface of the chip 100. The pads 190, and 191 are connected to a power line 189 inside the chip 100. The pad 195 is used for input/output of signals. The semiconductor chip 100 may have a micro bump on the rear surface of the chip 100. The semiconductor chip 100 may have a contact (may be referred to as a through electrode or TSV) that penetrates through the inside of the chip 100.

The pads 190, and 191 of the semiconductor chip 100 are connected to an interconnect (or a terminal connected to the interconnect) 691 on the package substrate 600, for example, via a bonding wire 699. The pads 190, and 191 may be connected to the interconnect 691 from the rear surface side of the semiconductor chip 100 by the through electrode or micro bump.

The interconnect 691 on the front surface of the package substrate 600 is connected to an external connection terminal 693 on the rear surface of the package substrate 600 via a contact (or interconnect) 692 provided inside the package substrate 600. The external connection terminal 693 is, for example, a solder bump or a solder ball.

The external connection terminal 693 is connected to the interconnect (or a terminal connected to the interconnect) 90 on the printed wiring substrate 901.

An input/output circuit (hereinafter, represented by I/O circuit) 110 is provided inside the semiconductor chip 100. A power supply voltage (drive voltage) V1 for driving the I/O circuit 110 is applied to the I/O circuit 110 via the internal interconnect (power line) 189 inside the semiconductor chip 100.

In the present embodiment, a plurality of pads 190, and 191 are connected to one I/O circuit 110 via the power line 189.

In the example of FIG. 3, two pads 190, and 191 are connected to the power line (power supply terminal) 189 of the I/O circuit 110.

One pad 190, is electrically connected to a power supply circuit 2 via the interconnect of the package substrate 600 and the interconnect 90 on the printed wiring substrate 901. Hereinafter, the pad 190 connected to the power supply circuit 2 may be referred to as a power source pad.

The other pad 191 is electrically connected to a capacitor circuit 200 on the package substrate 600 (in the package material 700).

Figure 4:
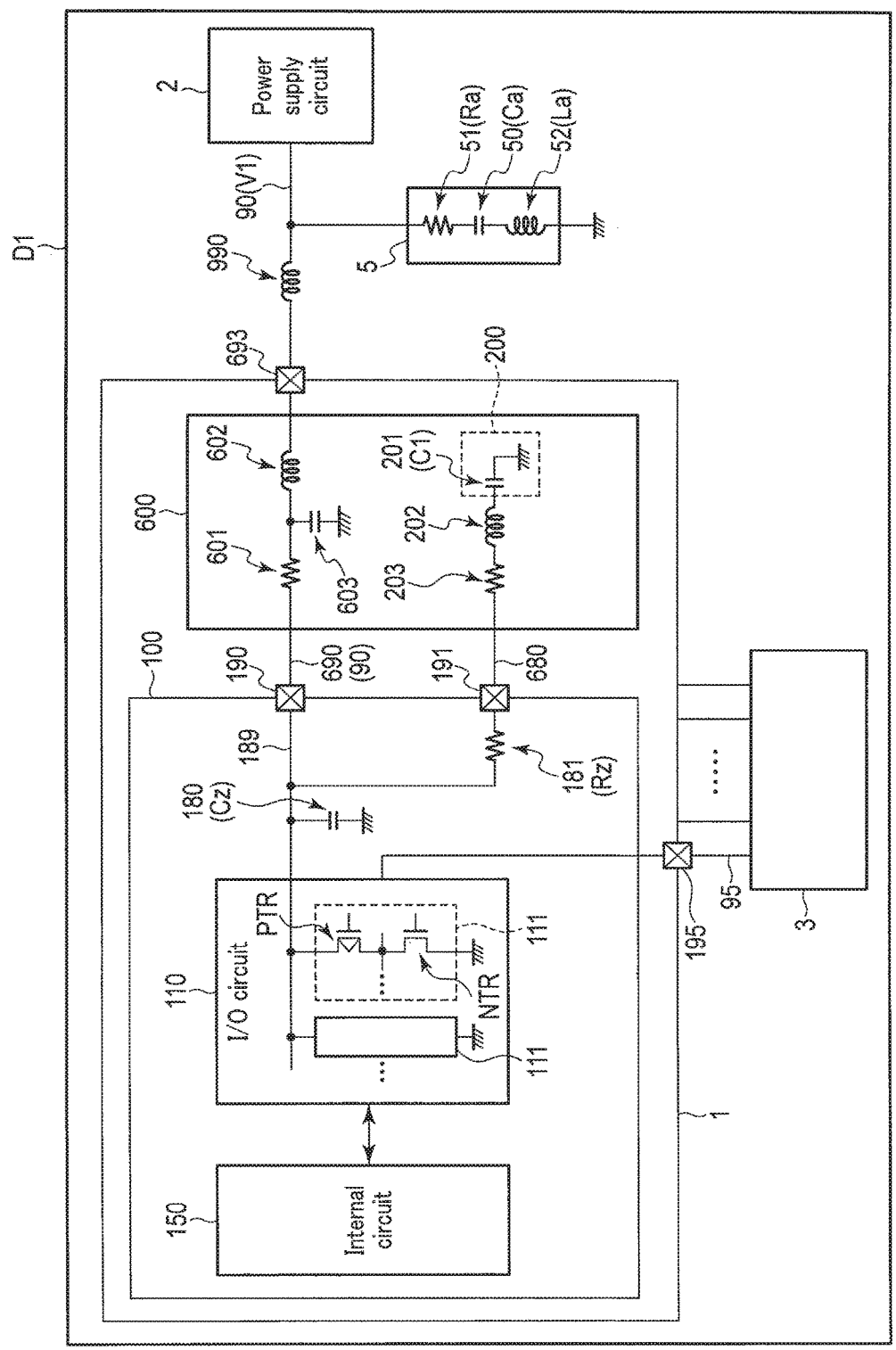
FIG. 4 is a diagram showing a configuration example of electronic equipment and a semiconductor device according to a first embodiment.

FIG. 4 is a diagram showing a configuration example of a semiconductor device (electronic device) in electronic equipment according to the present embodiment.

As shown in FIG. 4, a semiconductor device 1 as a first electronic device includes an I/O circuit (input/output circuit) 110 and an internal circuit 150.

The I/O circuit 110 functions as part of an interface circuit in the semiconductor device 1. The I/O circuit 110 includes a plurality of I/O units 111. The I/O unit 111 is, for example, a buffer. The buffer 111 includes at least one P-type transistor PTR and at least one N-type transistor NTR. A current path of the P-type transistor PTR and a current path of the N-type transistor NTR are connected in series between interconnect 189 and a ground line. In the buffer 111, the connection node of the transistor PTR with the transistor NTR becomes an input/output node of a signal (data).

An internal circuit 150 has one or more circuit blocks for realizing desired functions.

The I/O circuit 110 is electrically connected to the internal circuit 150. Between the I/O circuit 110 and the internal circuit 150, various signals (e.g., data and control signals) are transmitted and received. A signal in the internal circuit 150 is output to a second electronic device (e.g., semiconductor device) 3 via the I/O circuit 110. The signal from the second electronic device 3 is supplied to the internal circuit 150 via the I/O circuit 110.

For example, a voltage V3 is supplied to the internal circuit 150 via the interconnect on a printed wiring substrate 901 and the interconnect on a package substrate 600. For example, a supply path (power source system) of the voltage relative to the internal circuit 150 is independent of a supply path of the voltage relative to the I/O circuit 110.

A voltage V1 is supplied to the I/O circuit 110. In the semiconductor chip 100, a voltage terminal of the I/O circuit 110 is connected to the interconnect 189. The voltage V1 is applied to the interconnect 189. The voltage V1 is commonly supplied to the plurality of I/O units 111 in the I/O circuit 110.

A capacitance element 180 and a resistance element 181 are connected to the interconnect 189.

One end of the capacitance element 180 is connected to the interconnect 189. The other end of the capacitance element 180 is grounded. For example, the capacitance element 180 has a capacitance value Cz. The resistance element 181 is connected between the interconnect 189 and a pad 191.

One end of the resistance element 181 is connected to the interconnect 189. The other end of the resistance element 181 is connected to the pad 191. For example, the resistance element 181 has a resistance value Rz.

The capacitance element 180 functions as a decoupling element relative to the power line 189. The resistance element 181 functions as a damping resistance relative to the power line 189. Noise of the power line 189 can be suppressed by the capacitance element 180 and the resistance element 181. The capacitance value Cz and resistance value Rz are suitably set based on a simulation result and a test result of the semiconductor device (electronic device). The value of the capacitance value Cz is suitably set based on the length of the power line, the number of I/O units 111 connected to the power line, and the like.

A voltage terminal of the I/O circuit 110 is connected to a plurality of pads (herein, two) pads 190, and 191 via the interconnect 189.

Of the two pads 190 and 191 connected to the power supply terminal of the I/O circuit 110, one pad 190 is connected to a power supply circuit 2.

The pad 190 is connected to an interconnect 690 of the package substrate 600 and an external connection terminal 693. The interconnect 690 and the external connection terminal 693 are connected to the power supply circuit 2 via an interconnect 90 on a printed wiring substrate 901. Hereinafter, the interconnect 690 may be referred to as a power line. The external connection terminal 693 may be referred to as a power supply terminal.

For example, the power line 690 (and the power supply terminal 693) includes a resistance component 601, an inductance component 602, and a capacitance component 603. For example, the components 601, 602, and 603 are parasitic components resulting from the interconnect 690, and the substrate 600. For example, it is desired that in the inductance component 602 of the package substrate 600, an inductance value of the inductance component 602 be lower than 200 pH.

For example, the power line 90 includes an inductance component 990. For example, the inductance component 990 is a parasitic component resulting from the interconnect 90, and the substrate 901.

The parasitic components of the power line 90 and the power line 690 are reflected on the impedance of a power line 189 inside the semiconductor chip 100.

A stabilization capacitor circuit (e.g., chip capacitor) 5 is connected to the power line 90. The stabilization capacitor circuit 5 includes a capacitance element 50, a resistance element 51, and an inductance element 52. For example, one end of the resistance element 51 is connected to the power line 90. The other end of the resistance element 51 is connected to one end of the capacitance element 50. The other end of the capacitance element 50 is connected to one end of the inductance element 52. The other end of the inductance element 52 is grounded.

The capacitance element 50 has a capacitance value Ca. The resistance element 51 has a resistance value Ra. The inductance element 52 has an inductance value La.

The stabilization capacitor circuit 5 reduces effects of the parasitic components included in the interconnects (power lines) 90 and 690.

Of the two pads 190 and 191 connected to the power supply terminal of the I/O circuit 110, the pad 191 is connected to a capacitor circuit 200.

For example, the capacitor circuit 200 is provided on the package substrate 600. The capacitor circuit 200 is connected to the pad 191 via an interconnect 680 of the package substrate 600.

For example, the capacitor circuit 200 includes at least one capacitance element 201. The capacitance element 201 has a capacitance value C1.

One end of the capacitance element 201 is connected to the pad 191. The other end of the capacitance element 201 is connected to a ground terminal (e.g., ground line), and is grounded. A ground terminal and a ground line to which a ground voltage VSS is applied may be represented by a ground terminal VSS and a ground line VSS, respectively.

The capacitance element 201 is connected, between the power line 189 and the ground terminal, to the resistance element 181 inside the semiconductor chip 100, in series, via the pad 191. The capacitance element 201 is connected to the power line 189 via the resistance element 181.

The interconnect 680 includes an inductance component 202 and a resistance component 203. For example, the inductance component 202 and the resistance component 203 are parasitic components included in the interconnect 680. The inductance component 202 and the resistance component 203 reside on the interconnect so as to be inserted between one end of the capacitance element 201 and the pad 191.

Note that the inductance component 202 and the resistance component 203 may be an inductance element designed or a resistance element designed as a configuration element of the capacitor circuit 200. In this case, for example, one end of the resistance component 203 is connected to the pad 191. The other end of the resistance component 203 is connected to one end of the inductance component 202. The other end of the inductance component 202 is connected to one end of the capacitance element 201.

When the power supply circuit supplies a power supply voltage V1 to the power lines 90, 189, and 690, a current flows from the power line 189 to the resistance element 181. The current is supplied to the capacitance element 201 via the resistance element 181, pad 191, and interconnect 680. A current path (branched flow) which is branched from the power lines 90, 189, and 690 into the capacitance element 201 is formed. The capacitance element 201 is charged by a current supplied. For example, a charge potential of the capacitance element 201 varies in accordance with the potential of the interconnect 189.

The interconnects 90, 189, and 690 connecting the power supply circuit 2 with the I/O circuit 110 have an impedance. Even if the power supply circuit 2 outputs a constant voltage V1 to the interconnect 90, the potential of the power line 189 of the I/O circuit 110 fluctuates resulting from the impedance.

In the present embodiment, the size of the impedance of the power line 189 is adjusted by the resistance element 181 and the capacitor circuit 200.

With this configuration, the electronic equipment and the semiconductor device (electronic device) of the present embodiment can suppress a resonance phenomenon caused by the impedance of the power line 189.

For example, in the present embodiment, a configuration including the resistance element 181 and the capacitor circuit 200 may be referred to as an impedance adjusting circuit. In the present embodiment, the pad 191 to which the resistance element 181 and the capacitor circuit 200 are connected may be referred to as a resonance-suppressing terminal (or impedance-controlling terminal).

In the electronic equipment and the semiconductor device according to the present embodiment, the capacitance element 201 is connected to the power line 189 of the I/O circuit 110 via the pad 191.

With this configuration, the electronic equipment and the semiconductor device of the present embodiment can reduce the impedance occurring on the supply path between the I/O circuit 110 and the power supply circuit 2 without increasing the chip size (area) of the semiconductor chip in the semiconductor device.

As a result, the electronic equipment and the semiconductor device according to the present embodiment can suppress a degradation of operation characteristics.

(b) Characteristics

Figure 5:
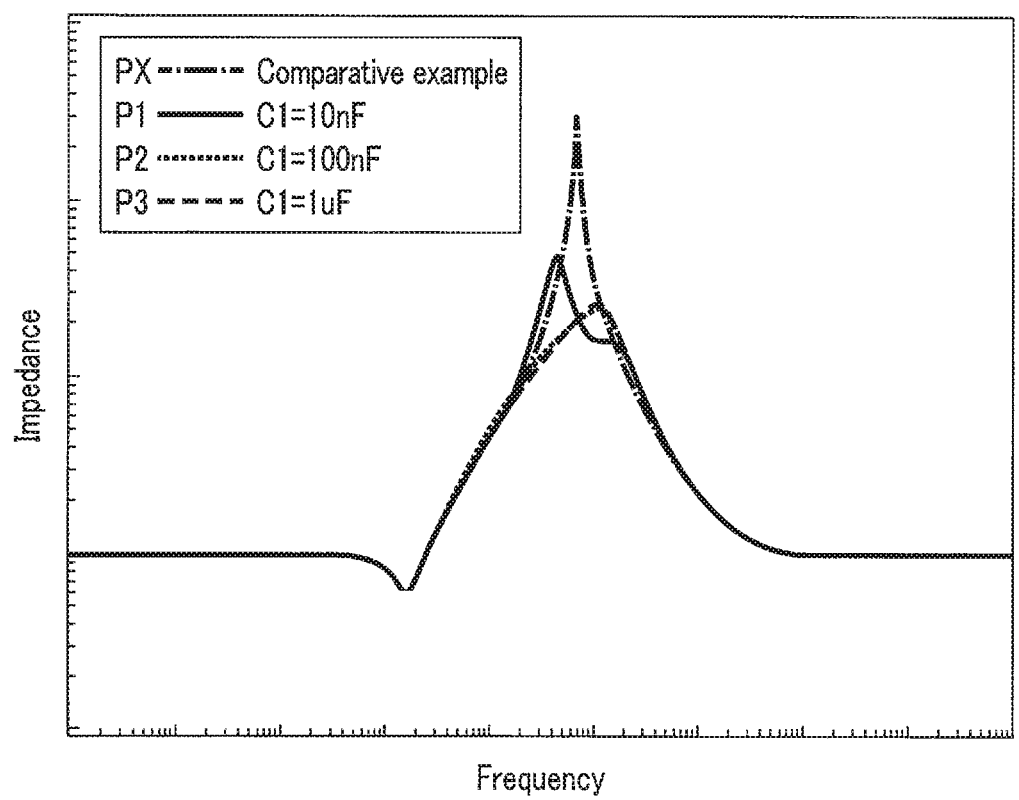
FIG. 5 is a diagram showing one example of characteristics of the semiconductor device according to the first embodiment.

FIG. 5 is a diagram illustrating the frequency dependency of the power line of a semiconductor device according to the present embodiment.

In FIG. 5, the horizontal axis (log scale) of the graph corresponds to a frequency of a voltage supplied to a power line, and the vertical axis (log scale) of the graph corresponds to an impedance value of the power line.

In FIG. 5, characteristic lines P1, P2, and P3 show frequency characteristics (frequency dependency) related to each condition of the power line of the I/O circuit in the semiconductor device according to the present embodiment.

The characteristic line P1 shows a characteristic when the capacitance value C1 of the capacitance element 201 in the capacitor circuit 200 of the semiconductor device 1 is 10 nF. The characteristic line P2 shows a characteristic when the capacitance value C1 of the capacitance element 201 in the capacitor circuit 200 of the semiconductor device 1 is 100 nF. The characteristic line P3 shows a characteristic when the capacitance value C1 of the capacitance element 201 in the capacitor circuit 200 of the semiconductor device 1 is 1 µF.

In FIG. 5, the characteristic line PX shows a comparative example relative to the semiconductor device of the present embodiment. In the semiconductor device of the comparative example corresponding to the characteristic line PX, one pad is connected to a power line of one I/O circuit. In the semiconductor device of the comparative example, a capacitance element for decoupling is connected to the power line of the I/O circuit.

Even if a direct-current voltage is applied to the power line during operation of the semiconductor device, a frequency component may be generated due to the influence of noise occurring in the power line. In this case, the impedance of the power line varies due to the frequency dependency (self-noise) of the power line, caused by a parasitic volume, a parasitic inductance, and a parasitic resistance contained in the power line. In this way, the power line of the semiconductor device is influenced by the frequency component caused by noise in the voltage supplied.

As shown in FIG. 5, in the semiconductor device according to the present embodiment, a resistance element 181 is connected to a power line 189 of an I/O circuit 110, and a capacitance element 201 is connected to the power line 189 via the pad 191.

The capacitance element 201 is charged or discharged in response to a change in potential of the power line 189 caused by the noise. By charging or discharging the capacitance element 201, a current flows between the power line 189 and the capacitance element 201.

With this configuration, in the semiconductor device of the present embodiment, a peak value of impedance of the power line 189 is reduced.

For example, in the present example, if the frequency is in the vicinity of 100 MHz, the impedance of the power line 189 is reduced.

Furthermore, in the semiconductor device of the present embodiment, the position (frequency) of the peak value of the impedance of the power line 189 tends to shift to a high-frequency range with an increase in the capacitance value C1 of the capacitance element 201.

(c) Conclusion

As explained above, in the electronic equipment and the semiconductor device (electronic device) according to the present embodiment, a capacitance element on a package substrate is connected to a power line of an I/O circuit in the semiconductor device via a pad provided to the semiconductor device. In the electronic equipment and the semiconductor device according to the present embodiment, a resistance element and the capacitance element are connected in series between the power line of the I/O circuit and a ground line.

With this configuration, the electronic equipment and the semiconductor device of the present embodiment can reduce a peak value of the impedance of the power line.

Therefore, the electronic equipment and the semiconductor device of the present embodiment can suppress a degradation of the operation characteristics of the semiconductor device due to a resonance phenomenon caused by noise, such as SSO (Simultaneous Switching output) noise.

In the electronic equipment and the semiconductor device of the present embodiment, the capacitance element is provided outside of the semiconductor chip (for example, on a package substrate).

For example, in a semiconductor memory that operates based on LPDDR standards or standards in compliance with the LPDDR standards, fluctuations in power supply voltage of the I/O circuit during inputting or outputting data may increase. If a capacitance element for decoupling is provided in a semiconductor memory of the LPDDR standards, the number of the capacitance elements is increased. In this case, the chip size of the semiconductor chip increases with an increase in the number of the capacitance elements, resulting in an increase in manufacturing costs.

The semiconductor device according to the present embodiment can suppress the increase in chip size of the semiconductor chip by the capacitance elements being provided outside the semiconductor chip.

The semiconductor device according to the present embodiment can suppress the increase in manufacturing costs of a semiconductor device as compared to a case where capacitance elements are provided inside a semiconductor chip.

As explained above, the electronic equipment and the semiconductor device of the present embodiment can suppress characteristic degradations. Furthermore, the electronic equipment and the semiconductor device according to the present embodiment can avoid an increase in manufacturing costs.

(2) Second Embodiment

In reference to FIG. 6, the electronic equipment and the semiconductor device according to a second embodiment will be explained.

FIG. 6 is a schematic circuit diagram for illustrating electronic equipment and a semiconductor device (electronic device) according to the present embodiment.

As shown in FIG. 6, in the semiconductor device of the present embodiment, a capacitor circuit (resonance-suppressing circuit) 200X to be connected to a pad (resonance-suppressing terminal, impedance-controlling terminal) 191 may be provided on a printed wiring substrate 901.

In this case, the capacitor circuit 200X is not provided on a package substrate 600 on which a semiconductor chip 100 is mounted. The capacitor circuit 200X is provided outside a package material that seals the semiconductor chip 100.

The capacitor circuit 200X is connected to as external connection terminal 694 of a semiconductor device 1 via an interconnect 98 on the printed wiring substrate 901. For example, the interconnect 98 includes an inductance component 980.

The external connection terminal 694 is connected, inside the semiconductor device 1, to a pad 191 via an interconnect 680. For example, the interconnect 680 includes a resistance component 601A, an inductance component 602A, and a capacitance component 603A.

The capacitor circuit 200X is, for example, a chip capacitor (chip condenser). If the capacitor circuit 200X is a chip capacitor, the capacitor circuit 200X includes an inductance element 202X and a resistance element 203X in addition to the capacitor circuit 201. For example, the inductance element 202X and resistance element 203X inside the capacitor circuit 200X are elements respectively designed so as to have a predetermined inductance value and a predetermined resistance value.

One end of the resistance element 203X is connected to the pad 694 via the interconnect 98. The other end of the resistance element 203X is connected to one end of the capacitance element 201. The other end of the capacitance element 201 is connected to one end of the inductance element 202X. The other end of the inductance element 202X is connected to a ground terminal and is grounded.

When the capacitor circuit 200X is provided on the printed interconnect 901, it is desired that a resistance value R1 of the resistance element 201X, an inductance value L1 of the inductance element 202X, and inductance values of the inductance component 602A and 980 be small. For example, the resistance value R1 is preferably a resistance value Ra or lower. For example, the inductance value L1 is preferably an inductance value La or lower.

In this way, in the electronic equipment and the semiconductor device according to the present embodiment, the capacitor circuit 200X on the printed wiring substrate 901 is connected to a power supply terminal of the I/O circuit 110 via the interconnects 98, 189, 680, and connection terminals 191, and 694.

With this configuration, the electronic equipment and the semiconductor device of the present embodiment can obtain substantially the same effect as in the electronic equipment and the semiconductor device according to the first embodiment.

By the capacitor circuit 200X being provided outside the package of the semiconductor device 1 like the present embodiment, the adjustment of the capacitance value C1 of the capacitor circuit 200X in response to the characteristics (test results) of the electronic equipment and the semiconductor device can be comparably easily implemented.

As explained above, the electronic equipment and the semiconductor device of the second embodiment can suppress degradations of operation characteristics.

(3) Third Embodiment

In reference to FIGS. 7 and 8, electronic equipment and a semiconductor device according to a third embodiment will be explained.

FIG. 7 is a schematic circuit diagram for illustrating electronic equipment and a semiconductor device according to the present embodiment.

As shown in FIG. 7, three or more pads, 190, 191A, and 191B may be connected in common to a power supply terminal of an I/O circuit 110. A plurality of pads (resonance-suppressing terminal) 191 are connected to a power supply terminal (power line 189) of one I/O circuit 110.

As explained above, the pad 190 is connected to a power supply circuit 2.

Capacitor circuits 200A, and 200B are respectively connected to pads (resonance-suppressing terminals) 191A, and 191B.

The pad 191A is connected to the capacitor circuit 200A on a package substrate 600. The capacitor circuit 200A includes a capacitance element 201A. The capacitance element 201A has a capacitance value C1.

An inductance component (inductance element) 202A and a resistance component (resistance element) 203A are connected in series between the capacitance element 201A and the pad 191A.

The pad 191B is connected to the capacitor circuit 200B on the package substrate 600. The capacitor circuit 200B includes a capacitance element 201B. The capacitance element 201B has a capacitance value C2. The size of the capacitance value C2 may be identical to that of the capacitance value C1 or may be different therefrom.

An inductance component (inductance element) 202B and a resistance component (resistance element) 203B are connected in series between the capacitance element 201B and the pad 191B.

For example, the inductance components 202A, and 202B and the resistance components 203A, and 203B are parasitic components included, for example, in interconnects 680A, 680B, respectively.

A plurality (herein, two) capacitance elements 201A, and 201B on the package substrate 600 are connected in parallel between a power line 189 and a ground line VSS.

A resistance element 181A is connected between the pad 191A and the power line 189. A resistance element 181B is connected between the pad 191B and the power line 189. The resistance element 181A and the capacitance element 201A are connected in series via the pad 191A. The resistance element 181B and the capacitance element 201B are connected in series via the pad 191B.

The resistance element 181A has a resistance value Rz1, and the resistance element 181B has a resistance value Rz2. The resistance elements 181A, and 181B function as a damping resistance.

Note that of the plurality of capacitor circuits 200A, and 200B, like in the second embodiment, one or more capacitor circuits may be provided on a printed wiring substrate 901.

There may be cases where the capacitor circuit 200 is connected to at least one terminal 191 of the plurality of resonance-suppressing terminals (pads) 191, and no capacitor circuit is connected to the other terminals in accordance with the impedance properties of the power line inside the semiconductor chip. Furthermore, there may be cases where no capacitor circuit is connected to all of the plurality of resonance-suppressing terminals 191 in accordance with the impedance properties of the power line inside the semiconductor chip.

Figure 8:
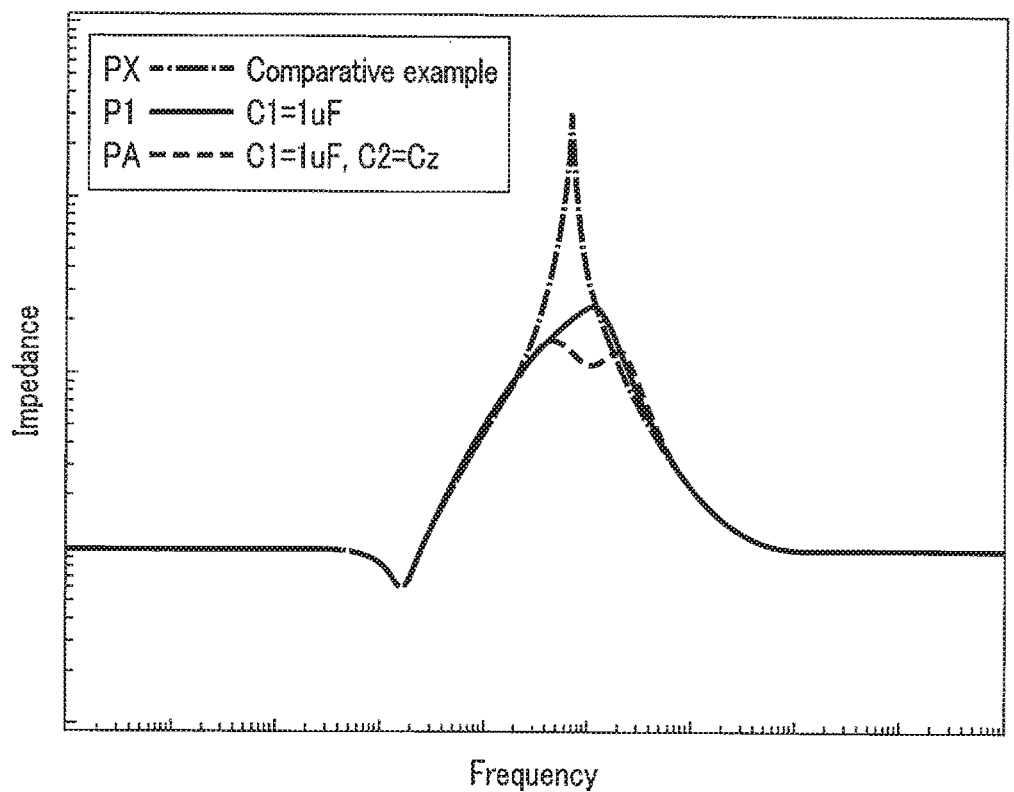
FIG. 8 is a diagram showing one example of characteristics of the semiconductor device according to the third embodiment.

FIG. 8 is a diagram for illustrating characteristics of electronic equipment and a semiconductor device according to the present embodiment.

In FIG. 8, the horizontal axis (log scale) of the graph corresponds to a frequency, and the vertical axis (log scale) of the graph corresponds to an impedance value.

In FIG. 8, a characteristic line PA shows frequency characteristics of the semiconductor device according to the present embodiment. For example, in a circuit corresponding to the characteristic line PA, two capacitance elements 201A, and 201B are connected, as shown in FIG. 7, to a power supply terminal (power line) of an I/O circuit 110 via pads 191A, and 191B, and resistance elements 181A, and 181B, respectively.

For example, a capacitance value C1 of the capacitance element 201 is set to 1 µF. A capacitance value C2 of the capacitance element 201B is set to a value identical to a capacitance value Cz of a capacitance element 180.

In FIG. 8, the characteristic line P1 shows a case where one capacitance element is connected to a power line like the first embodiment. The characteristic line PX shows a comparative example relative to a semiconductor device of the present embodiment. Note that the semiconductor device having the characteristic line PX shown in FIG. 8 has the same configuration as in the semiconductor device having the characteristic line PX shown in FIG. 5.

As shown in FIG. 8, the peak value of the impedance of the power line can be further reduced by increasing the number of capacitance elements.

Note that the number of peak values (projecting portions) of the impedance related to the frequency characteristics of the impedance of a power line 189 is commensurate with the number of capacitance elements 201 connected in parallel between the power line 189 and a ground line (the number of pads 190 connected to the power line 189). For example, as the number of capacitance elements 201 is increased, the peaks of the impedance have a tendency to be smoothed (the frequency dependency of the impedance of the power line tends to be smaller).

As described above, the electronic equipment and the semiconductor device of the present embodiment can produce the same effect as the first and second embodiments.

Therefore, the electronic equipment and the semiconductor device according to the third embodiment can suppress degradations of operation characteristics.

(4) Fourth Embodiment

In references to FIGS. 9 to 11, electronic equipment and a semiconductor device according to the fourth embodiment will be explained.

(a) Configuration Example

Figure 9:
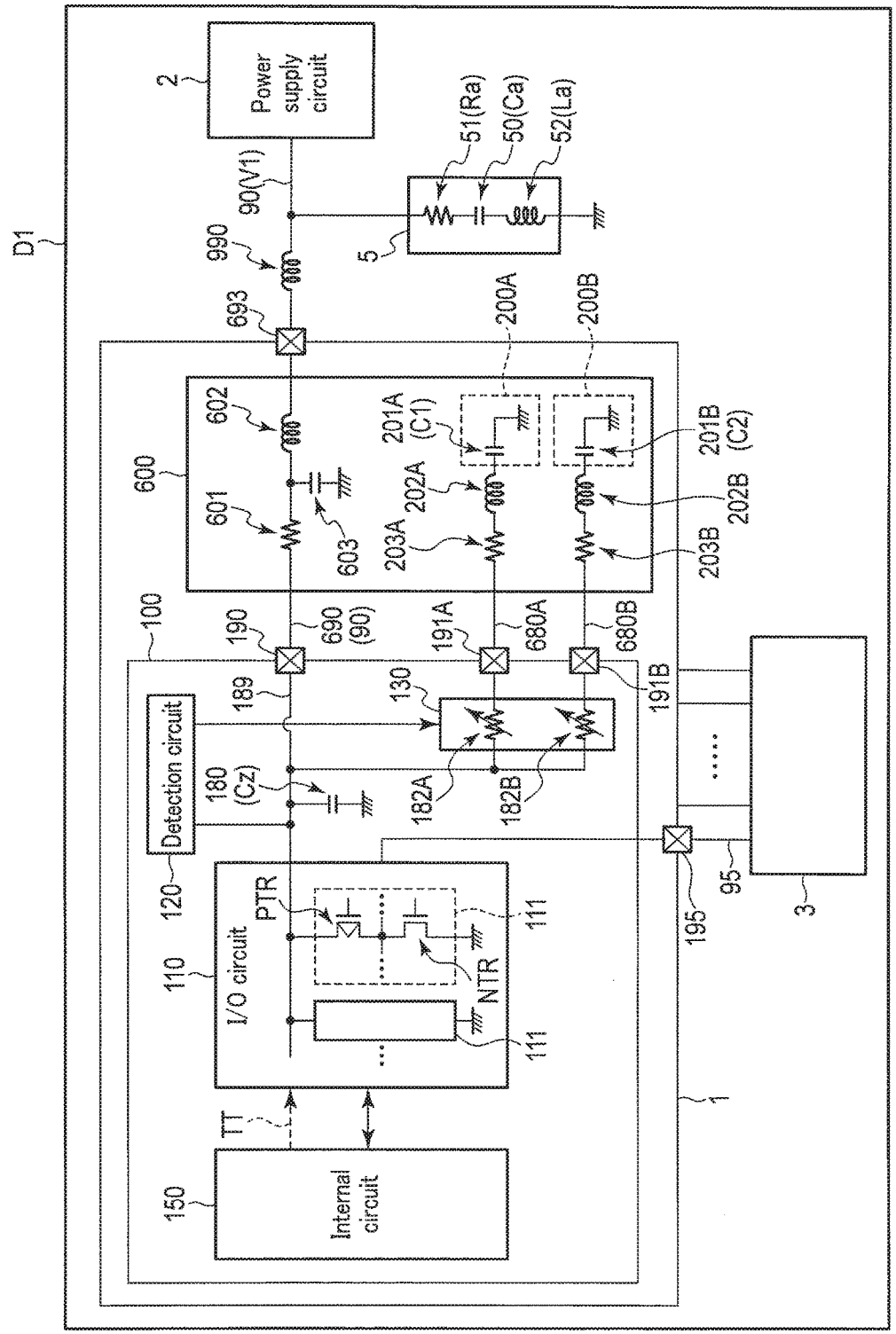
FIG. 9 is a diagram showing a configuration example of electronic equipment and a semiconductor device according to a fourth embodiment.

FIG. 9 is a schematic circuit diagram for illustrating electronic equipment and a semiconductor device according to the present embodiment.

As shown in FIG. 9, the semiconductor device (electronic device) 1 of the present embodiment includes a detection circuit 120 and a variable resistance circuit 130.

The detection circuit 120 is connected to a power supply terminal (power line 189) of an I/O circuit 110.

The detection circuit 120 detects a potential (voltage value) of the power line 189. The detection circuit 120 outputs a control signal CNT to the variable resistance circuit 130 based on a detection result. For example, the detection circuit 120 compares a potential of a reference voltage VREF with a potential of the power line 189. The value of the control signal CNT is set based on the comparison result.

The variable resistance circuit 130 is connected between the power line 189 and pads 191A, and 191B. The variable resistance circuit 130 includes a plurality of variable resistance elements 182A, and 182B that function as a damping resistance. One variable resistance element 182A and one variable resistance element 182B are connected to one pad 191A and one pad 191B, respectively.

The variable resistance circuit 130 controls resistance values of the variable resistance elements 182A, and 182B based on the control signal CNT from the detection circuit 120.

For example, an internal circuit 150 (or detection circuit 120) can supply a test signal TT to the I/O circuit 110, in setting a resistance value of the variable resistance circuit 130.

The electronic equipment and the semiconductor device according to the present embodiment can prevent a misoperation of the I/O circuit caused by a change in potential of the power line by controlling the resistance values of the variable resistance elements 182A, and 182B of the variable resistance circuit 130.

Note that the size of the impedance of the power line 189 may be adjusted to suppress a potential change of the power line by the variable capacitance elements being used in the capacitor circuits 200A, and 200B. The capacitance value of the variable capacitance element is controlled based on the detection result of the potential change of the power line 189.

In this case, the detection circuit is preferably provided on a package substrate common to a capacitor circuit 200 including variable capacitance elements.

Note that the number of variable resistance element 182 and the number of capacitor circuits 200 to be provided to one I/O circuit 110 may be one, respectively.

(b) Operation Example

An operation example of electronic equipment and a semiconductor device (electronic device) according to the present embodiment will be explained using FIGS. 10 and 11.

In the embodiment, an operation example where a semiconductor device 1 is a controller, and a device 3 is a semiconductor memory is illustrated as an example.

FIG. 10 is a flow chart for illustrating an operation example of electronic equipment and a semiconductor device according to the present embodiment.

The semiconductor device 1 as a controller (herein, a memory controller) starts a detection operation of a potential of a power line of the IO circuit 110 to control impedance of the power line of the I/O circuit 110 before issuing and transmitting a command, when the controller 1 gives the command to the device 3 as a semiconductor memory to execute a certain operation (herein, operation for writing data in the semiconductor memory) (Step S0).

The detection circuit 120 sets a resistance value of a variable resistance element 182 of the variable resistance circuit 130 within a period set before the start of the writing operation (hereinafter, referred to as a resistance value set period), based on the detection operation of the potential of the power line 189.

The detection circuit 120 detects a change in potential of the power line 189 during operation of the I/O circuit 110, while varying resistance values of variable resistance elements 189A, and 189B of the variable resistance circuit 130 (Step S1).

For example, the detection circuit 120 supplies data as a test signal TT to the I/O circuit 110 and detects a potential of the power line 189 when data values to be supplied to all of I/O units 111 in the I/O circuit 110 have changed (for example, changes from x0000 to xFFFF).

Figure 11:
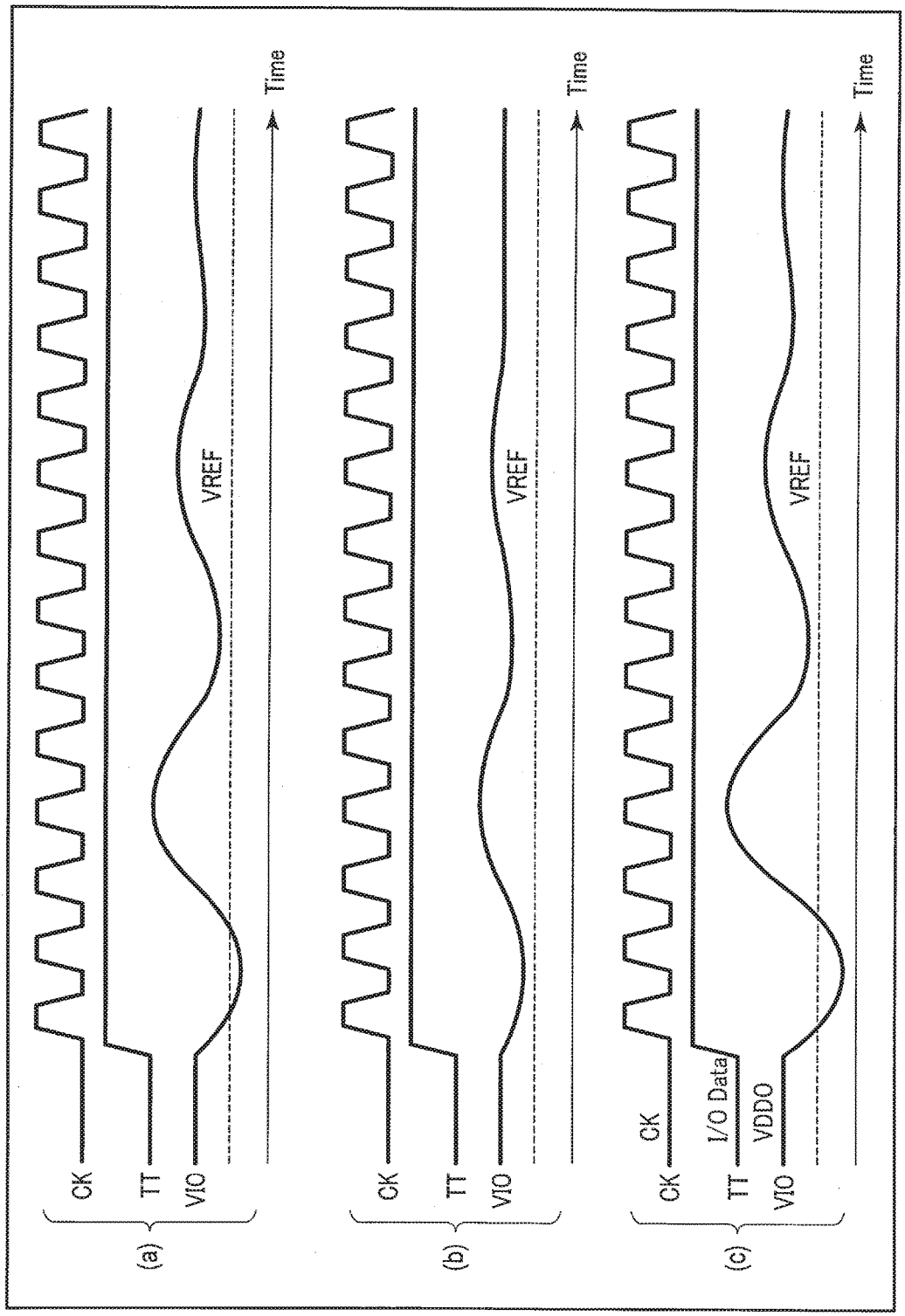
FIG. 11 is a diagram illustrating an operation example of the electronic equipment and the semiconductor device according to the fourth embodiment.

FIG. 11 is a graph showing a relationship between a resistance value of a variable resistance element and a potential of the power line in the semiconductor device according to the present embodiment.

(a), (b) and (c) of FIG. 11 are timing charts respectively showing a change in potential of the power line relative to a certain resistance value.

(a) of FIG. 11 shows a change in potential of the power line of the I/O circuit in a case where the resistance value of the variable resistance element 182 is 0.1Ω. (b) of FIG. 11 shows a change in potential of the power line of the I/O circuit in a case where the resistance value of the variable resistance element 182 is 0.5Ω. (c) of FIG. 11 shows a change in potential of the power line of the I/O circuit in a case where the resistance value of the variable resistance element 182 is 1.0Ω.

In (a) to (c) of FIG. 11, in synchronization with a clock signal CK, the potential of the power line 189 is detected (monitored) by the detection circuit 120 while a data value (signal level) of the test signal TT is being changed in each of the units 111. When (a) to (c) of FIG. 11 respectively show an output state of the signal, the signal level of the test signal TT is indicated at an "H" level.

The detection circuit 120 compares a value of a potential VIO of the power line 189 with a reference voltage VREF. The detection circuit 120 detects whether the value of the potential VIO is lower than the reference voltage VREF.

For example, in (a) and (c) of FIG. 11, there may be cases where in the resistance value set period, the value of the potential VIO becomes lower than the reference voltage VREF. When the value of the potential VIO is lower than the reference voltage VREF, there is a possibility that the I/O circuit 110 does not operate normally due to a low voltage supplied to the I/O circuit 110.

Therefore, when the resistance values of the variable resistance element are 0.1Ω and 1.0Ω, the resistance values are inappropriate for values for stabilizing the operation of the I/O circuit.

In (b) of FIG. 11, the value of the potential VIO is higher than the reference voltage VREF. When the value of the voltage VIO is higher than the reference voltage VREF, the voltage to be supplied to the I/O circuit 110 is higher than the drive voltage of the I/O circuit 110, and thus the I/O circuit 110 operates normally.

Therefore, when the resistance value of the variable resistance element 182 is 0.5Ω, the resistance value is determined as a resistance value for stabilizing the operation of the I/O circuit.

In this way, a resistance value in which a change in potential of the power line during operation of the I/O circuit of the controller 1 satisfies the allowance value is set as a resistance value of the variable resistance element 182 at the time of transferring data (and a signal) to a semiconductor memory 3.

The detection circuit 120 outputs a control signal CNT on which the detection result has been reflected to the variable resistance circuit 130. The variance resistance circuit 130 sets a resistance value of the variable resistance element 182 based on the control signal CNT (Step S2).

After the resistance value of the variable resistance element 182 is set to an appropriate value based on the detection result, a predetermined operation of the semiconductor memory 3 (herein, a writing operation) is started and executed (Step S3). For the writing operation, transfer of the signal and data is executed between the I/O circuit 110 and the semiconductor memory 3 in a state where adverse effects of the impedance of the I/O circuit are suppressed (e.g., in a state where resonance is suppressed).

As explained above, setting of a resistance value of the variable resistance element corresponding to a potential change of the power line by the detection circuit in the electronic equipment and the semiconductor device according to the present embodiment is completed.

In the semiconductor device according to the present embodiment, an operation based on a command or a request is executed after the resistance value of the variable resistance element as damping resistance has been set to a value at which the adverse effects of the impedance of the power line of the I/O circuit can be suppressed.

(c) Conclusion

In the electronic equipment and the semiconductor device according to the present embodiment, a resistance value of a variable resistance element is set for adjusting impedance of the power line by a detection circuit configured to detect a potential of the power line.

With this configuration, the electronic equipment and the semiconductor device of the present embodiment can obtain the effects explained in the first to the third embodiments and can suppress a misoperation of the input/output circuit 110 caused by a change in power supply voltage.

As described above, the electronic equipment and the semiconductor device of the fourth embodiment can suppress degradations in operation characteristics.

(5) Others

The present embodiments show an example where a plurality of pads and a plurality of capacitor circuits are connected to a power line connected to an I/O circuit.

However, in the present embodiment, to suppress the effects of the impedance of the power line, a plurality of pads may be connected to a power line of a circuit other than the I/O circuit, and capacitor circuits (capacitance elements) may be connected to one or more pads of the plurality of pads.

While certain embodiments have been described, these embodiments have been presented by way of example only, and are not intended to limit the scope or the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an input/output circuit in a semiconductor chip, a signal being input or output to or from the input/output circuit;
    a first terminal disposed on the semiconductor chip and electrically connected to a power line of the input/output circuit, a power supply voltage of the input/output circuit being applied from an outside of the semiconductor chip to the power line via, the first terminal, the power line being disposed in the semiconductor chip;
    a second terminal disposed on the semiconductor chip and electrically connected to the power line;
    a resistance element electrically connected between the second terminal and the power line in the semiconductor chip;
    a first capacitance element disposed outside the semiconductor chip and electrically connected between the second terminal and a ground terminal;
    a third terminal disposed on the semiconductor chip and electrically connected to the power line; and
    a second capacitance element electrically connected between the third terminal and the ground terminal.

2. The device according to claim 1, Wherein a capacitance value of the second capacitance element is equal to a capacitance value of the first capacitance element.

3. The device according to claim 1, Wherein the capacitance value of the second capacitance element differs from the capacitance value of the first capacitance element.

4. The device according to claim 1, further comprising:
    a detection circuit configured to detect a potential of the power line.

5. The device according to claim 4, wherein the resistance element is a variable resistance element, and the detection circuit sets a resistance value of the variable resistance element based on a detection result of the potential of the power line.

6. The device according to claim 1, further comprising:
    a package substrate on which the semiconductor chip is disposed,
    wherein the first capacitance element is disposed on the package substrate.

7. The device according to claim 1, further comprising:
    a package substrate on which the semiconductor chip is disposed,
    wherein the first capacitance element is disposed outside the package substrate.

8. The device according to claim 1, further comprising:
    a package substrate on which the semiconductor chip is disposed,
    wherein the first terminal is electrically connected to the power supply circuit via an interconnect of the package substrate.

9. The device according to claim 1, wherein the power supply voltage is a direct-current voltage.

10. Electronic equipment comprising:
    an electronic device including a semiconductor chip, an input/output circuit in the semiconductor chip, a signal being input or from the input/output circuit, a first terminal disposed on the semiconductor chip and electrically connected to a power line of the input/output circuit, a power supply voltage of the input/output circuit being applied from an outside of the semiconductor chip to the power line via the first terminal, the power line being disposed in the semiconductor chip, a second terminal disposed on the semiconductor chip and electrically connected to the power line, a resistance element electrically connected between the second terminal and the power line in the semiconductor chip, and a first capacitance element disposed outside the semiconductor chip and electrically connected between the second terminal and a ground terminal, a third terminal disposed on the semiconductor chip and electrically connected to the power line, and a second capacitance element electrically connected between the third terminal and the ground terminal; and
    a power supply circuit disposed outside the semiconductor chip and electrically connected to the first terminal, the power supply circuit applying the power supply voltage to the first terminal.

11. The equipment according to claim 10, wherein a capacitance value of the second capacitance element is equal to a capacitance value of the first capacitance element.

12. The equipment according to claim 10, wherein the capacitance value of the second capacitance element differs from the capacitance value of the first capacitance element.

13. The equipment according to claim 10, wherein the electronic device further includes a detection circuit configured to detect a potential of the power line.

14. The equipment according to claim 13, wherein the resistance element is a variable resistance element, and the detection circuit sets a resistance value of the variable resistance element based on a detection result of the potential of the power line.

15. The equipment according to claim 10, wherein the electronic device further includes a package substrate on which the semiconductor chip is disposed,
    wherein the first capacitance element is disposed on the package substrate.

16. The equipment according to claim 10, further comprising:
    a printed wiring substrate including an interconnect,
    wherein the electronic device, the power supply circuit, and the first capacitance element are provided on the printed wiring substrate, and the interconnect electrically connects the power supply circuit to the electronic device.

17. The apparatus according to claim 10, further comprising:
    a printed wiring substrate including an interconnect,
    wherein the electronic device and the power supply circuit are provided on the printed wiring substrate, and the interconnect electrically connects the power supply circuit to the electronic device.

18. The equipment according to claim 10, wherein the power supply voltage is a direct-current voltage.

\* \* \* \* \*